(12) United States Patent
Choi

(10) Patent No.: US 6,783,903 B2
(45) Date of Patent: Aug. 31, 2004

(54) SEMICONDUCTOR DESIGN FOR IMPROVED DETECTION OF OUT-OF-FOCUS CONDITIONS

(75) Inventor: Willys Choi, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 98 days.

(21) Appl. No.: 10/003,508

(22) Filed: Nov. 1, 2001

(65) Prior Publication Data
US 2003/0082467 A1 May 1, 2003

(51) Int. Cl.⁷ ................................................ G03F 9/00
(52) U.S. Cl. ........................................ 430/30; 382/145
(58) Field of Search ............................. 430/30; 382/145

Primary Examiner—Christopher G. Young
(74) Attorney, Agent, or Firm—Tung & Associates

(57) ABSTRACT

A semiconductor design patternable on a semiconductor wafer for improved detection of out-of-focus conditions during lithographic processing is disclosed. The semiconductor design includes a central main body, and at least one arm extending from sides of the central main body. Each arm has a first one or more at least substantially triangular shapes, and a disconnected second one or more at least substantially triangular shapes. A tip of the first shapes is positioned opposite a tip of the second shapes, such that a gap there between is formed. The gap is sensitive to out-of-focus conditions during lithographic processing, where the gap increases as defocus increases. Increasing of the gap as defocus increases is preferably automatically detectable by semiconductor test equipment.

20 Claims, 6 Drawing Sheets

SEMICONDUCTOR DESIGN FOR IMPROVED DETECTION OF OUT-OF-FOCUS CONDITIONS

FIELD OF THE INVENTION

This invention relates generally to semiconductor device fabrication, and more particularly to the detection of out-of-focus conditions during lithographic processing.

BACKGROUND OF THE INVENTION

Since the invention of the integrated circuit (IC), semiconductor chip features have become exponentially smaller and the number of transistors per device exponentially larger. Advanced IC's with hundreds of millions of transistors at feature sizes of 0.25 micron, 0.18 micron, and less are becoming routine. Improvements have allowed optical steppers to significantly reduce the resolution limit for semiconductor fabrication far beyond one micron. To continue to make chip features smaller, and increase the transistor density of semiconductor devices, IC's have begun to be manufactured that have features smaller than the lithographic wavelength. Sub-wavelength lithography, however, places large burdens on lithographic processes. Resolution of anything smaller than a wavelength is generally quite difficult. Pattern fidelity can deteriorate dramatically in sub-wavelength lithography. The resulting semiconductor features may deviate significantly in size and shape from the ideal pattern drawn by the circuit designer.

One particular issue that impacts the quality of lithography is focus variation, which is nearly ubiquitous in IC manufacturing because of the combined effects of many problems, such as wafer non-flatness, auto-focus errors, leveling errors, lens heating, and so on. A useful lithographic process should be able to print acceptable patterns in the presence of some focus variation. Similarly, a useful lithographic process should be able to print acceptable patterns in the presence of variation in the exposure dose, or energy, of the light source being used. To account for these simultaneous variations of exposure dose and focus (or lack thereof), it is useful to map out the process window, such as an exposure-defocus (ED) window, within which acceptable lithographic quality occurs. The process window for a given feature shows the ranges of exposure dose and depth of focus (DOF) that permit acceptable lithographic quality.

For example, FIG. 1 shows a graph 100 of a typical ED process window for a given semiconductor pattern feature. The y-axis 102 indicates exposure dose of the light source being used, whereas the x-axis 104 indicates DOF. The line 106 maps exposure dose versus DOF at one end of the tolerance range for the critical dimension (CD) of the pattern feature, whereas the line 108 maps exposure dose versus DOF at the other end of the tolerance range for the CD of the feature. The area 110 enclosed by the lines 106 and 108 is the ED process window for the pattern feature, indicating the ranges of both DOF and exposure dose that permit acceptable lithographic quality of the feature. Any DOF-exposure dose pair that maps within the area 110 permits acceptable lithographic quality of the pattern feature. As indicated by the area 110, the process window is typically indicated as a rectangle, but this is not always the case, nor is it necessary.

To detect out-of-focus conditions, as well as to measure feature CD, a particular semiconductor design for this purpose may be included on an unused part of the semiconductor wafer. FIG. 2 shows one such design 200, the width 202 of which corresponds to the desired feature CD. The design 200 has two lower arms 204 and 206. Unfortunately, the design 200 does not allow for easy detection of out-of-focus conditions during lithographic processing. This is shown in FIG. 3. The graph 300 measures CD on the y-axis 302, corresponding to the width 202 of the design 200 of FIG. 2, and defocus on the x-axis 304, with best focus substantially in the middle of the x-axis 304. A reference line 306 indicates 0.3 micron, and another reference line 307 indicates 0.2 micron. As defocus decreases and then increases along the x-axis 304, the width 202 as indicated by the line 308 barely decreases before increasing again.

Utilization of the semiconductor design 200 to detect out-of-focus conditions during lithographic processing thus is accomplished only with great difficulty. Because of the minute changes in the width 202 of the design 200 as defocus decreases and then increases, the measuring mode on lithographic equipment is typically switched from automatic measuring to manual measuring. Automatic measuring is substantially machine performed, requiring little human oversight, whereas manual measuring is substantially human performed. This great involvement by the semiconductor technicians is expensive and time-consuming, however, slowing the rate at which semiconductor devices can be fabricated, which is costly to the semiconductor manufacturer.

Therefore, there is a need for a semiconductor design that allows for easier detection of out-of-focus conditions during lithographic processing. Such a design should allow for automatic measuring to be performed, so that unacceptable defocus can be machine detected. Such a design, in other words, should desirably allow for defocus detection without the need for expensive and time-intensive technician involvement. For these and other reasons, there is a need for the present invention.

SUMMARY OF THE INVENTION

The invention relates to a semiconductor design patternable on a semiconductor wafer for improved detection of out-of-focus conditions during lithographic processing. The semiconductor design includes a central main body, and at least one arm extending from sides of the central main body. Each arm has a first one or more at least substantially triangular shapes, and a disconnected second one or more at least substantially triangular shapes. A tip of the first shapes is positioned opposite a tip of the second shapes, such that a gap there between is formed. The gap increases in size as defocus increases.

The invention provides for advantages not found within the prior art. The gap is sensitive to out-of-focus conditions during lithographic processing, and the increase in gap size is preferably automatically detectable by semiconductor test equipment. Thus, the equipment does not have to be switched to manual mode for manual detection of defocus by semiconductor technicians. Rather, the equipment itself can automatically detect when out-of-focus conditions have occurred. This results in less costly and faster defocus detection. Other advantages, embodiments, and aspects of the invention will become apparent by reading the detailed description that follows, and by referencing the attached drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
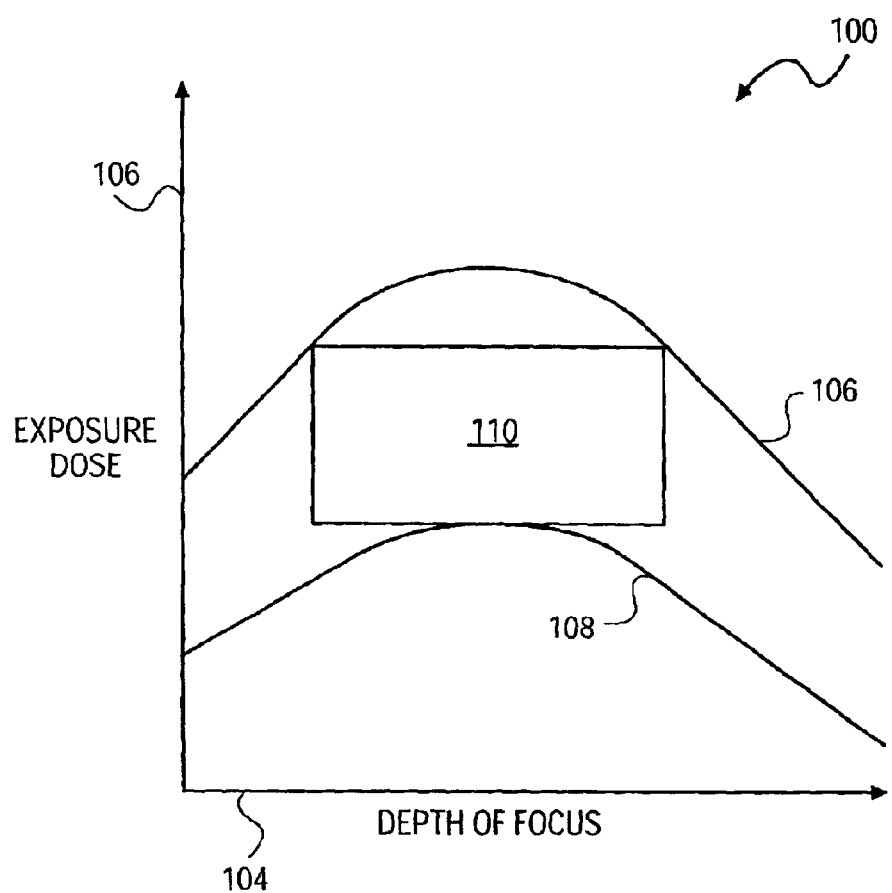
FIG. 1 is a diagram showing an example exposure-defocus (ED) process window for a given pattern feature showing the ranges of exposure dose and focus that permit acceptable lithographic quality.
Figure 2:
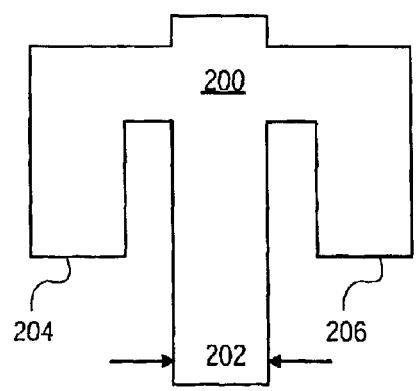
FIG. 2 is a diagram of a prior art semiconductor design used for detecting out-of-focus conditions and for critical dimension (CD) measurement.
Figure 3:
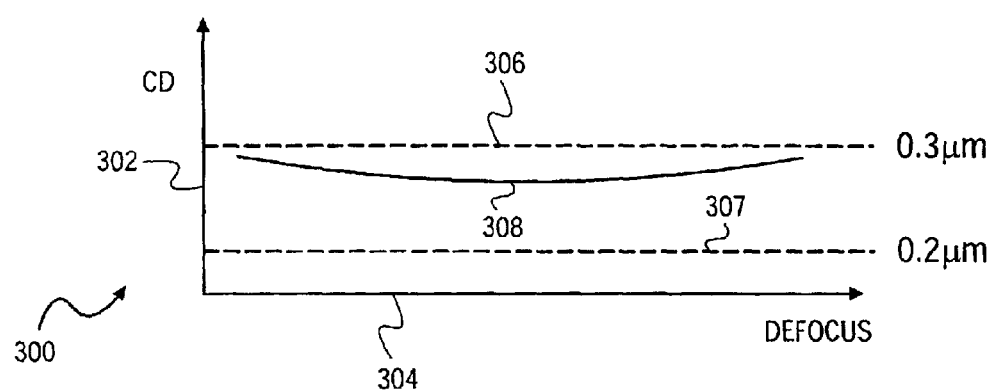
FIG. 3 is a graph measuring the CD of the design of FIG. 2 as defocus is decreased and then increased.
Figure 4:
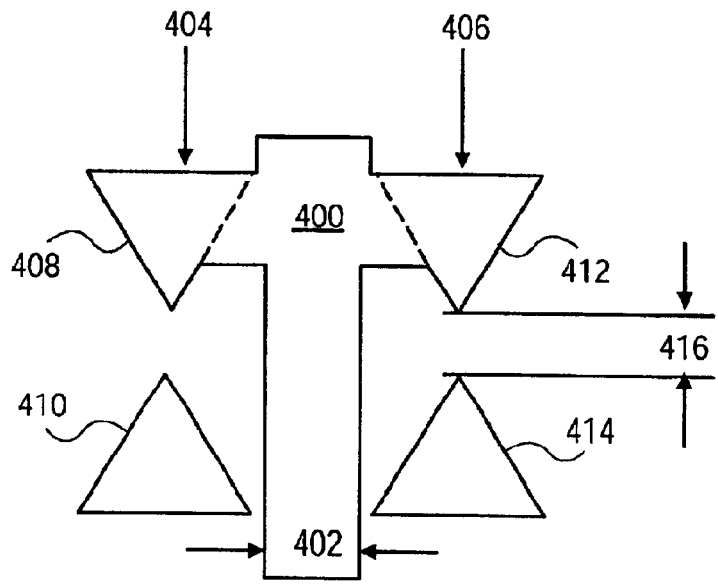
FIG. 4 is a diagram of a semiconductor design used for easier detection of out-of-focus conditions, according to an embodiment of the invention.

FIG. 4 shows a semiconductor design 400 according to an embodiment of the invention for easier detection of out-of-focus conditions, where the design 400 is preferably patterned on a semiconductor wafer and subsequently inspected by appropriate semiconductor test or other equipment. From the sides of the central main body of the design 400, which is substantially rectangular in shape, emanate two arms 404 and 406, where the arm 404 is off the left side of the central main body, and the arm 406 is off the right side of the central main body. The arm 404 includes a downward-pointing substantially triangular shape 408, opposite of which is a disconnected upward-pointing substantially triangular shape 410. The tip of the shape 408 is opposite the tip of the shape 410, forming a gap there between. The shape 410 is disconnected in that it does not touch the shape 408, or preferably any other part of the design 400.

Similarly, the arm 406 includes a downward-pointing substantially triangular shape 412, opposite of which is a disconnected upward-pointing substantially triangular shape 414. The tip of the shape 412 is opposite the tip of the shape 414, forming a gap 416 there between. Preferably, the gap 416 is identical in length to the gap between the tips of the shapes 408 and 410, which is not specifically called out in FIG. 4. The shape 414 is disconnected in that it does not touch the shape 412, or preferably any other part of the design 400. One or more of the shapes 408, 410, 412, and 414 can in one embodiment be one or more triangles.

Figure 5:
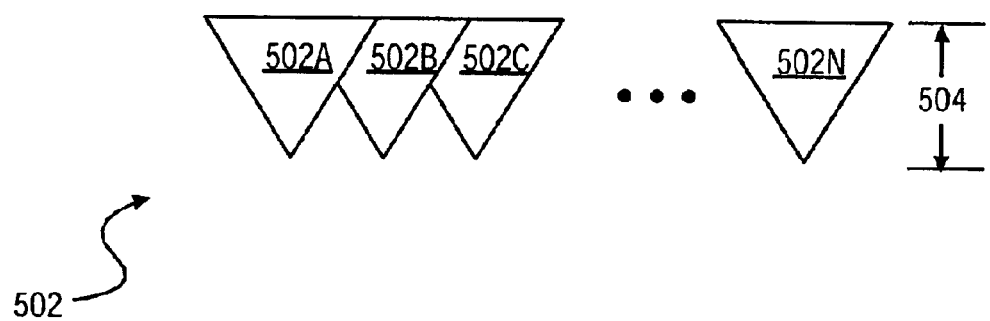
FIG. 5 is a diagram of an alternative arm(s) of the design of FIG. 4, according to an embodiment of the invention.

FIG. 5 shows alternative substantially triangular shapes 502 that can be used as and/or in lieu of any of the substantially triangular shapes 408, 410, 412, and 414, according to an embodiment of the invention. The triangular shapes 502 specifically include a number of overlapping substantially triangular shapes 502a, 502b, 502c, . . . , 502d. That is, the shapes 502 can as a whole replace any of the shapes 408, 410, 412, and 414 of FIG. 4. Any of the overlapping triangular shapes 502, 502b, 502c, . . . , 502d can in one embodiment be triangles. The shapes 502 as shown in FIG. 5 have a length 504.

Figure 6:
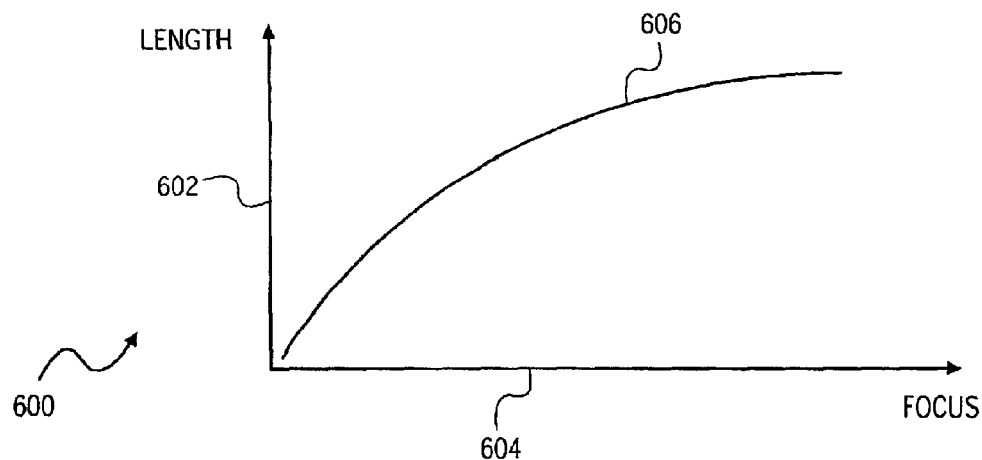
FIG. 6 is a graph measuring the length of gap between triangular shapes of the design of FIG. 4 as focus is increased, according to an embodiment of the invention.

FIG. 6 shows a graph 600 illustrating how the length of the substantially triangular shapes of FIGS. 4 and 5, such as the length 504 of FIG. 5, changes as focus is increased, or made better. The graph 600 measures the length of the shapes on the y-axis 602, as a function of the focus, from worst focus to best focus, on the x-axis 604. As the focus on the semiconductor wafer on which the semiconductor design 400 has been patterned is increased, the length of shapes correspondingly increases.

Thus, by measuring the length of the shapes, or more preferably the gap that forms between two oppositely pointed such shapes, such as the gap 416 of FIG. 4, which doubles the relationship of the line 606 on the y-axis 602 as compared to the x-axis 604, out-of-focus conditions can be detected. As focus worsens, the length of the shapes decreases, and the gap between two oppositely pointed such shapes increases. Conversely, as focus betters, the length of the shape increases, and the gap between two oppositely pointed such shapes decreases. The gap and the length are thus sensitive to out-of-focus conditions during lithographic processing. As used herein, the phrase measuring the gap between two oppositely pointed shapes is inclusive of measuring the length of either or both of the shapes themselves.

Figure 7:
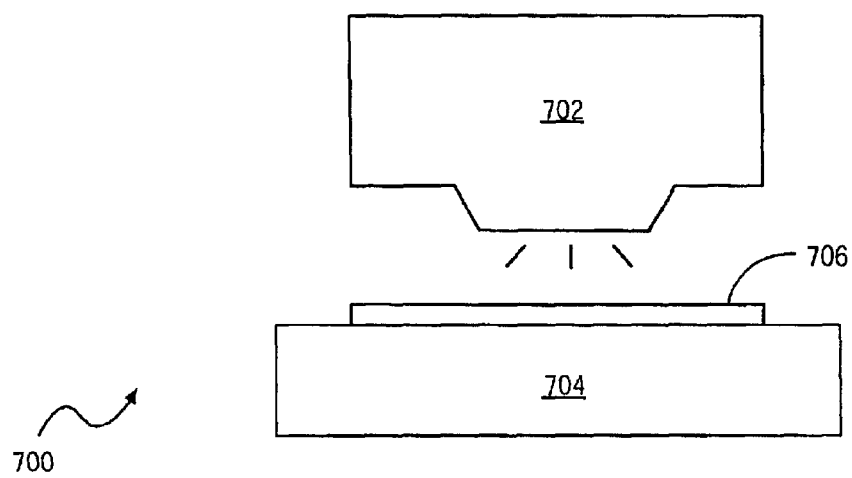
FIG. 7 is a diagram of a side profile of a system showing a wafer having a design according to an embodiment of the invention for easier detection of out-of-focus conditions placed on a stage and being subjected to semiconductor test equipment.

FIG. 7 shows a system 700 according to an embodiment of the invention in conjunction with which the semiconductor design 400 of FIG. 4 can be used. A semiconductor wafer 706 is placed or positioned on a stage 704. Semiconductor equipment 702 is positioned over the wafer 706. The semiconductor equipment 702 measures critical and/or other dimensions of designs on or of the devices on the wafer 706. For instance, the gap 416 of the design 400 of FIG. 4 can be measured by the semiconductor equipment 702. Preferably, the semiconductor equipment 702 is a piece of semiconductor lithography equipment. The equipment 702 preferably has an automatic measurement or detection mode for measuring dimensions on the wafer 706 and/or for detecting defocus out of a given specification. Thus, where defocus is greater than the specification allows, the equipment 702 automatically detects this out-of-focus condition without technician involvement.

Figure 8:
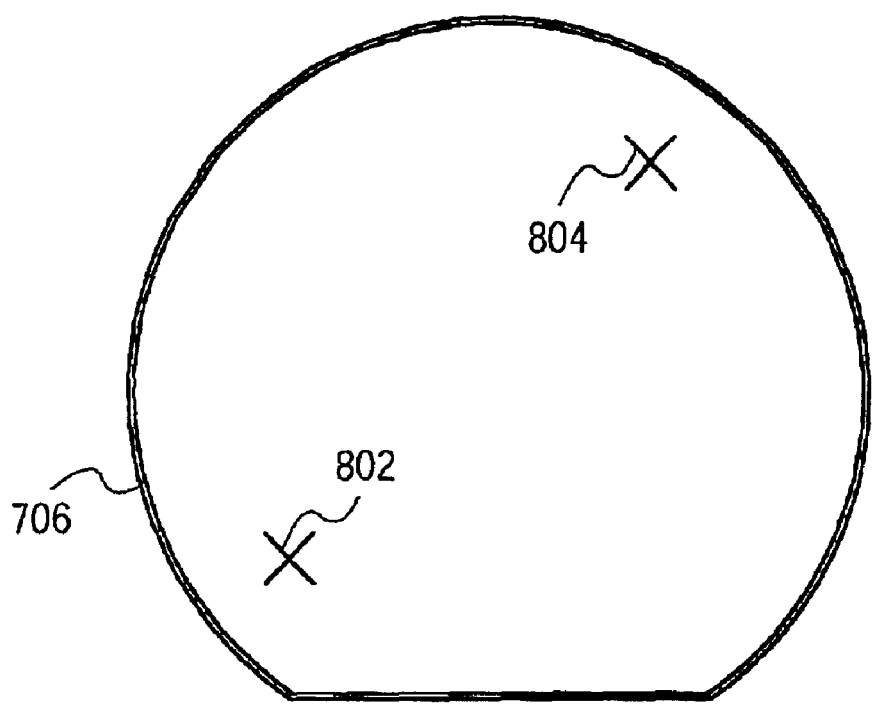
FIG. 8 is a diagram of a top profile of the wafer of FIG. 7, showing the placement of the design on the wafer according to an embodiment of the invention.

FIG. 8 shows an example of where the semiconductor design 400 of FIG. 4 can be patterned on a semiconductor wafer, such as and specifically the semiconductor wafer 706 of FIG. 7. Specifically, the design 400 of FIG. 4 can be placed in diagonally opposite corners of the wafer 706, such as the positions 802 and 804 as indicated in FIG. 8. Those of ordinary skill within the art can appreciate, however, that the positions 802 and 804 are examples only, and that a semiconductor design according to the invention can be patterned in other locations on the semiconductor wafer 706 as well.

Figure 9:
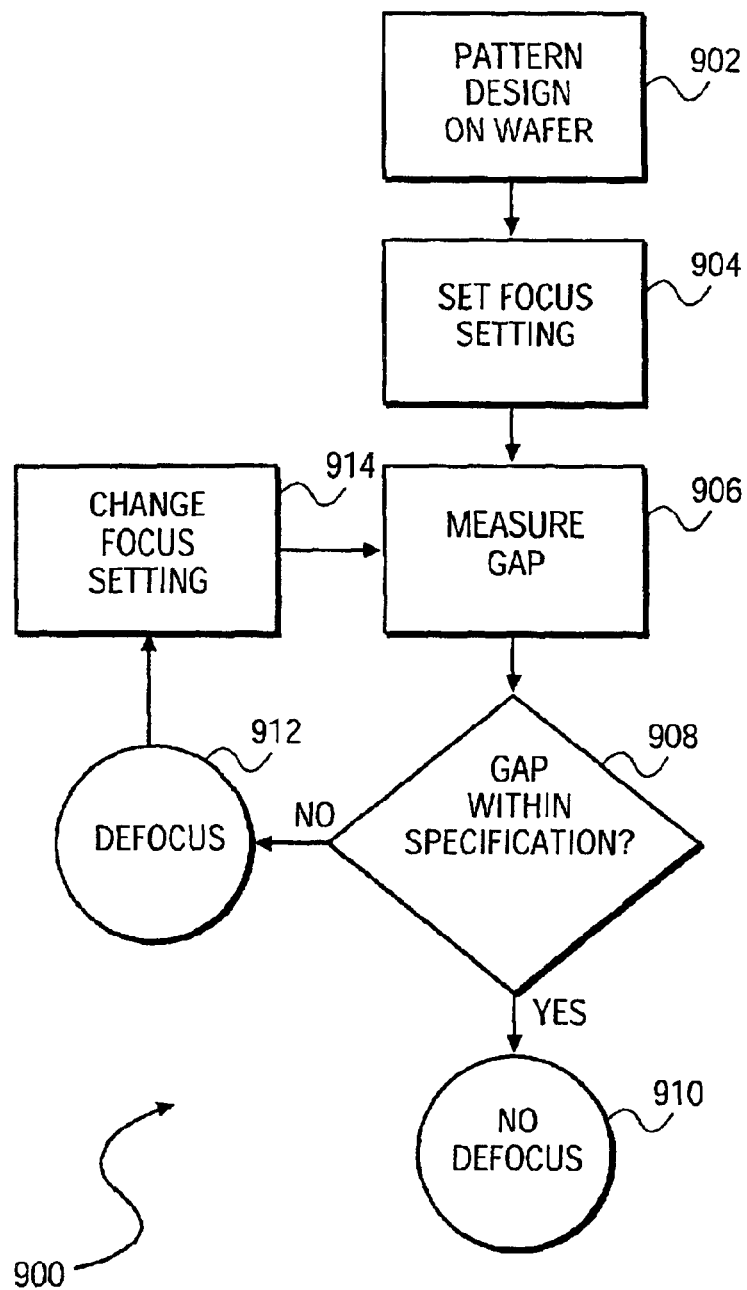
FIG. 9 is a flowchart according to an embodiment of the invention.

FIG. 9 shows a method 900 according to an embodiment of the invention. First, a design for easier detection of out-of-focus conditions, such as the design 400 of FIG. 4, is imprinted or patterned on a semiconductor wafer (902), as known within the art. The focus setting of semiconductor equipment, such as the semiconductor equipment 702 of FIG. 7, is set to an initial setting, and a dimension measurement and/or out-of-focus measurement automatic mode is entered into (904). The gap between two oppositely pointed substantially triangular shapes is then automatically measured preferably without technician or other human involvement, such as by directly measuring the gap, or by measuring the length of either or both of the shapes (906).

The gap is compared to a given specification, such that if the gap is out of the specification (908), then this indicates an unacceptable out-of-focus or defocus condition (912). Therefore, the focus setting of the equipment is changed (914), such as either by increasing or decreasing the setting, and automatic gap measuring (906) and comparing the measurement against the specification (908) are repeated until the gap is within the specification. Once the gap is found to be within the specification (908), then the method 900 ends with an indication than an acceptable focus condition has resulted (910). That is, the method 900 ends with an indication that the out-of-focus or defocus condition is not unacceptable.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A semiconductor design for easing detection out-of-focus conditions during lithographic processing, the design patternable on a semiconductor wafer and comprising:
    a central main body; and,
    an arm extending from a side of the central main body having a first one or more substantially triangular shapes and a disconnected second one or more substantially triangular shapes, a tip of the first one or more substantially triangular shapes positioned opposite a tip of the second one or more substantially triangular shapes, such that a gap therebetween is formed.

2. The design of claim 1, wherein the central main body is least substantially rectangular in shape.

3. The design of claim 1, wherein the arm extends from the side of the central main body less than half-way down from a top of the central main body.

4. The design of claim 1, wherein each of the first and the second one or more substantially triangular shapes comprises one or more triangles.

5. The design of claim 4, wherein the first triangles comprise a single triangle, and the second triangles comprise a single triangle.

6. The design of claim 1, further comprising a second arm extending from an opposite second side the central main body having a third one or more substantially triangular shapes and a disconnected fourth one or more substantially triangular shapes, a tip of the third one or more substantially triangular shapes positioned opposite a tip of the fourth one or more triangular shapes, such that a second gap therebetween is formed.

7. The design of claim 6, wherein the second arm extends from the opposite side of the central main body less than half-way down from a gap of the central main body.

8. The design of claim 6, wherein each of the third and the fourth one or more substantially triangular shapes comprises one or more triangles.

9. The design of claim 8, wherein the third triangles comprise a single triangle, and the fourth triangles comprise a single triangle.

10. The design or claim 1, wherein the gap is sensitive to out-of-focus conditions during the lithographic processing.

11. The design of claim 1 wherein the gap increases as defocus increases.

12. The design of claim 11, wherein increasing of the gap as defocus increases is automatically detectable by semiconductor test equipment.

13. A method for detecting out-of-focus conditions during lithographic processing comprising:
    automatically measuring at a focus setting a gap formed within a semiconductor design patterned on a semiconductor wafer, the semiconductor design having a central main body and one arm extending from sides of the central main body, each arm having a first one or more substantially triangular shapes and a disconnected second one or more at substantially triangular shapes, a tip of the first one or more at substantially triangular shapes positioned opposite a tip of the second one or more at substantially triangular shapes, the gap formed therebetween;
    comparing the gap against a specification; and,
    concluding that defocus has resulted where the gap is out of the specification.

14. The method of claim 13, further initially comprising patterning the semiconductor design on the semiconductor wafer.

15. The method of claim 13, further comprising, otherwise concluding that defocus has not resulted where the gap is within the specification.

16. The method of claim 13, further comprising, where the gap is out of the specification:
    changing the focusing setting; and,
    repeating measuring at the focus setting the gap, comparing the gap against the specification, and concluding that defocus has resulted where the gap is out of the specification, until the gap is within the specification.

17. The method of claim 13, wherein the gap is sensitive to out-of-focus conditions during the lithographic processing.

18. The method of claim 13, wherein the gap increases as defocus increases.

19. The method of claim 18, wherein increasing of the gap as defocus increases is automatically detectable by semiconductor test equipment.

20. A system comprising:
    a semiconductor test equipment having an automatic mode of defocus detection;
    a semiconductor design having a central main body and at least one arm extending from aides of the central main body, each arm having a first one or more substantially triangular shapes and disconnected second one or more substantially triangular shapes, a tip of the first one or more substantially triangular shapes positioned opposite a tip of the second one or more substantially triangular shapes, a gap formed therebetween; and,
    a semiconductor wafer on which the semiconductor design is patterned, the gap of the semiconductor design increasing as defocus increases, such that the automatic mode of defocus detection is able to detect when the gap is out of a predetermined specification, for concluding that unacceptable defocus has resulted.

* * * * *